(12) United States Patent
Shima et al.

(10) Patent No.: US 7,923,711 B2
(45) Date of Patent: Apr. 12, 2011

(54) SWITCHING ELEMENTS AND PRODUCTION METHODS THEREOF

(75) Inventors: Hisashi Shima, Tsukuba (JP); Hiroyuki Akinaga, Tsukuba (JP); Fumiyoshi Takano, Tsukuba (JP); Yukio Tamai, Osaka (JP)

(73) Assignees: National Institute of Advanced Industrial Science and Technology, Tokyo (JP); Sharp Corporation, Osaka (JP)

( * ) Notice: Subject to any disclaimer, the term of this patent is extended or adjusted under 35 U.S.C. 154(b) by 646 days.

(21) Appl. No.: 11/881,575

(22) Filed: Jul. 26, 2007

(65) Prior Publication Data
US 2008/0054243 A1 Mar. 6, 2008

(51) Int. Cl.
*H01L 47/00* (2006.01)
(52) U.S. Cl. ............................ 257/2; 257/4
(58) Field of Classification Search .......... 257/1–5, 257/E45.002
See application file for complete search history.

(56) References Cited

U.S. PATENT DOCUMENTS
2004/0245557 A1 12/2004 Seo et al.
2007/0117256 A1* 5/2007 Stewart et al. ............ 257/2
2010/0012911 A1 1/2010 Akinaga et al.

FOREIGN PATENT DOCUMENTS
JP 2004-363604 12/2004

OTHER PUBLICATIONS

Akinaga et al., "Resistive Switching Effect in Metal/Insulator/Metal Heterostructures and Its Application for Non-volatile Memory", *Institute of Electrical Engineers of Japan*, 2 (4), pp. 453-457, Jul. 2007.
Baek et al., "Highly Scalable Non-volatile Resistive Memory using Simple Binary Oxide Driven by Asymmetric Unipolar Voltage Pulses", *IEEE*, 2004.
Gibbons et al., "Switching Properties of Thin NiO Films", *Solid-State Electronics*, vol. 7, pp. 785-797, 1964.
Hosoi et al., "High Speed Unipolar Switching Resistance RAM (RRAM) Technology", *IEEE*, 30.7.1, 2006.
Kim et al., "Electrical observations of filamentary conductions for the resistive memory switching in NiO films", *Applied Physics Letters*, vol. 88, pp. 202102-1-202102-3, 2006.
Liu et al., "Electric-pulse-induced reversible resistance change effect in magnetoresistive films", *Applied Physics Letters*, vol. 76, No. 19, pp. 2749-2751, May 8, 2000.
Muramatsu et al., "Crystallographic and Resistance Switching Properties of $TiO_x$ Thin Films Annealed under Oxygen Radial Atmosphere", *The 54th Spring Meeting, 2007, The Japan Society of Applied Physics*, p. 673, 2007.

(Continued)

*Primary Examiner* — Cuong Q Nguyen
(74) *Attorney, Agent, or Firm* — Hamilton, Brook, Smith & Reynolds, P.C.

(57) ABSTRACT

The present invention provides switching elements having a readout margin suitable for data storage units of nonvolatile memories, which are obtained by improving the resistance ratio of metal oxide thin films having reversible variable resistance properties. The present invention provides switching elements having a metal oxide consisting of a transition metal and oxygen formed between a first electrode and a second electrode, by modifying one or more of the crystal structure, ionic valence number of metal element, and nonstoichiometricity of a stoichiometric compound consisted of the transition metal and oxygen. The present invention also provides methods for producing switching elements having reversible variable resistance characteristics due to electric power application history.

8 Claims, 4 Drawing Sheets

OTHER PUBLICATIONS

Seo et al., "Reproducible resistance switching in polycrystalline NiO films", *Applied Physics Letters*, vol. 85, No. 23, pp. 5655-5657, Dec. 6, 2004.

Shima et al., "Large electrical resistance change in Pt/CuO$_x$/Pt trilayer", *The 67$^{th}$ Autumn Meeting, 2006, The Japan Society of Applied Physics*, p. 578, 2006.

Shima et al., "Resistance switching and asymmetric electrical properties in Ti oxide synthesized by reactive sputtering", *The 54$^{th}$ Spring Meeting, 2007, The Japan Society of Applied Physics*, p. 674, 2007.

Shima et al., "Resistance switching and voltage polarity dependent forming process in Co oxide", *The 68$^{th}$ Autumn Meeting, 2007, The Japan Society of Applied Physics*, p. 648, 2007.

Shima et al., "Reproducible Resistance Switching in Ni/Nio/Ni Trilayer", *MRS Spring Meeting*, p. 181, 2007.

Shima et al., "Synthesis and Characterization of Pt/Co-O/Pt Trilayer Exhibiting Large Reproducible Resistance Switching", *Japanes Journal of Applied Physics*, vol. 46, No. 3, pp. L57-L60, 2007.

Shima et al., "Resistance switching in the metal deficient-type oxides: NiO and CoO", *Applied Physics Letters 91*, pp. 012901-1-012901-3, 2007.

Takano et al., "Dry etching process of Tio$_x$ film—Application to fabrication of ReRAM device", *The Ninth International Symposium on Sputtering and Plasma Processes (ISSP 2007)*, pp. 160-162, 2007.

Takano et al., "Reactive Ion Etching of Transition-Metal Oxides", *The 24$^{th}$ Symposium on Plasma Processing (SPP-24)*, pp. 145-146, 2007.

Tomita et al., "Nonvolatile resistance memory effect on W/CuO/Pt structure", *The 67$^{th}$ Autumn Meeting, 2006, The Japan Society of Applied Physics*, p. 573, 2006.

Tomita et al., "Nonvolatile resistive memory effect and rectification on Pt/Tio$_x$/Pt structure", *The 54$^{th}$ Spring Meeting, 2007, The Japan Society of Applied Physics*, p. 684, 2007.

Yasuda et al., "Nonvolatile resistive memory characteristics in metal/binary transition metal oxdis", *The 53$^{th}$ Spring Meeting, 2006, The Japan Society of Applied Physics*, p. 642, 2006.

H. Akinaga et al., "Resistive Switching Effect in Metal/Insulator/Metal Heterostructures and Its Application for Non-volatile Memory", *Institute of Electrical Engineers of Japan*, 2 (4): 453-7, Jul. 2007.

I. G. Baek et al., "Highly Scalable Non-volatile Resistive Memory using Simple Binary Oxide Driven by Asymmetric Unipolar Voltage Pulses", *IEEE*, 2004.

J. F. Gibbons et al., "Switching Properties of Thin NiO Films", *Solid-State Electronics*, vol. 7, pp. 785-595, 1964.

Y. Hosoi et al., "High Speed Unipolar Switching Resistance RAM (RRAM) Technology", *IEEE*, 30.7.1, 2006.

D. C. Kim, et al., "Electrical observations of filamentary conductions for the resistive memory switching in NiO films", *Applied Physics Letters*, vol. 88, 2006.

S. Q. Liu, et al., "Electric-pulse-induced reversible resistance change effect in magnetoresistive films", *Applied Physics Letters*, vol. 76, No. 19, May 8, 2000.

H. Muramatsu, et al., "Crystallographic and Resistance Switching Properties of TiO$_x$ Thin Films Annealed under Oxygen Radial Atmosphere", *The 54$^{th}$ Spring Meeting, 2007, The Japan Society of Applied Physics*, p. 673, 2007.

S. Seo, et al., "Reproducible resistance switching in polycrystalline NiO films", *Applied Physics Letters*, vol. 85, No. 23, Dec. 6, 2004.

H. Shima, et al., "Large electrical resistance change in Pt/CuO$_x$/Pt trilayer", *The 67$^{th}$ Autumn Meeting, 2006, The Japan Society of Applied Physics*, p. 673, 2006.

H. Shima, et al., "Resistance switching and asymmetric electrical properties in Ti oxide synthesized by reactive sputtering", *The 54$^{th}$ Spring Meeting, 2007, The Japan Society of Applied Physics*, p. 674, 2007.

H. Shima, et al., "Resistance switching and voltage polarity dependent forming process in Co oxide", *The 68$^{th}$ Autumn Meeting, 2007, The Japan Society of Applied Physics*, p. 648, 2007.

H. Shima, et al., "Reproducible Resistance Switching in Ni/Nio/Ni Trilayer", *MRS Spring Meeting*, p. 181, 2007.

H. Shima, et al., "Synthesis and Characterization of Pt/Co-O/Pt Trilayer Exhibiting Large Reproducible Resistance Switching", *Japanes Journal of Applied Physics*, vol. 46, No. 3, p. L57-L60, 2007.

H. Shima, et al., "Resistance switching in the metal deficient-type oxides: NiO and CoO", *Applied Physics Letters 91*, 2007.

F. Takano, et al., "Dry etching process of Tio$_x$ film—Application to fabrication of ReRAM device", *The Ninth International Symposium on Sputtering and Plasma Processes (ISSP 2007)*, p. 160-162, 2007.

F. Takano, et al., "Reactive Ion Etching of Transition-Metal Oxides", *The 24$^{th}$ Symposium on Plasma Processing (SPP-24)*, p. 145-146, 2007.

H. Tomita, et al., "Nonvolatile resistance memory effect on W/CuO/Pt structure", *The 67$^{th}$ Autumn Meeting, 2006, The Japan Society of Applied Physics*, p. 573, 2006.

H. Tomita, et al., "Nonvolatile resistive memory effect and rectification on Pt/Tio$_x$/Pt structure", *The 54$^{th}$ Spring Meeting, 2007, The Japan Society of Applied Physics*, p. 684, 2007.

S. Yasuda, et al., "Nonvolatile resistive memory characteristics in metal/binary transition metal oxdis", *The 53$^{th}$ Spring Meeting, 2006, The Japan Society of Applied Physics*, p. 642, 2006.

* cited by examiner

SWITCHING ELEMENTS AND PRODUCTION METHODS THEREOF

CROSS REFERENCE TO RELATED APPLICATIONS

This application claims the benefit of Japanese Application No. 2006-203025 filed Jul. 26, 2006, the entire contents of which are hereby incorporated by reference.

FIELD OF INVENTION

The present invention relates to switching elements comprising metal oxides having reversible variable resistance due to electric power application history, and production methods thereof. More specifically, the present invention relates to switching elements in which the reversible variable resistance properties of metal oxides have been improved by high temperature heat treatment, and production methods thereof.

BACKGROUND OF THE INVENTION

Known nonvolatile memory elements used to retrieve information by detecting variation in resistance properties include Ovonic Unified Memories (OUMs), which use chalcogenide compounds as in phase-change optical disks such as DVD-RAMs and possess the characteristic of having large resistance property variations between crystalline and amorphous states.

Meanwhile, there are recently known techniques for producing nonvolatile memory devices that use metal oxide films such as $NiO$, $V_2O_5$, $ZnO$, $Nb_2O_5$, $TiO_2$, $WO_3$, or $CoO$ as data storage material layer, which take advantage of the property that their resistance drastically increases or decreases within a given voltage range. Each data storage material layer is addressed using transistors and such that are laid on each of these data storage material layers; the resistance properties of the metal oxide films are controlled by supplying a given voltage application history; and the information retained in the data storage material layers are retrieved by detecting their resistance properties (see Japanese Patent Application Kokai Publication No. (JP-A) 2004-363604 (unexamined, published Japanese patent application)).

Also known are techniques that produce memories by using the ferroelectric material of $Pr_{0.7}Ca_{0.3}MnO_3$ as data storage layer, changing the resistance properties by about 10 to 1000 times by switching the voltage applied to the data storage layer made of a ferroelectric material between plus and minus at a predetermined magnitude, and detecting the resistance properties (see Applied Physics Letters, Vol. 76, No. 19 (2000), pp. 2749-2751).

On the other hand, it has been reported that the resistance property switching phenomena between 100-200Ω and 10-20Ω in nickel oxide thin films, which are formed by exposing a nickel substrate in an oxygen atmosphere, approximately match with calculation results obtained when formation and rupture of Ni fiber filaments formed in NiO matrix is assumed (see Solid-State Electronics, Vol. 7 (1964), pp. 785-797).

Similarly, it has been reported that when NiO was used as a metal oxide in a metal-metal oxide-metallic structure, a bi-stable resistance memory switching phenomenon was observed. This phenomenon could be explained by local formation and rupture of filament conduction passes, and Joule heat is considered to play an important role (see Solid-State Electronics, Vol. 7 (1964), pp. 785-797).

SUMMARY OF THE INVENTION

Although a certain readout margin is obtained with Ovonic Unified Memories (OUMs) as resistance varies approximately 1000 times between the states of high-resistance and low-resistance, it is difficult to sufficiently increase the speed of data rewriting because OUMs use the transformation between crystalline/amorphous states. OUMs also have the disadvantage of requiring large electric currents.

Meanwhile, the techniques exemplified in Japanese Patent Application Kokai Publication No. (JP-A) 2004-363604 (unexamined, published Japanese patent application) and Applied Physics Letters, Vol. 76, No. 19 (2000), pp. 2749-2751 directly detect the resistance value of the entire memory layer. Thus, similar and rapid operations can be expected even if the size of the memory cells is made smaller. However, optimization of device design has not been achieved because the principle that generates reversible and widely differing resistance properties has not yet been sufficiently elucidated.

In particular, the technique exemplified in Japanese Patent Application Kokai Publication No. (JP-A) 2004-363604 (unexamined, published Japanese patent application) uses stoichiometric compounds of metal elements and oxides as memory layers. However, not only the technology to produce stoichiometric compounds of metal elements and oxides is not established, in principle, it is also impossible to produce stoichiometric compounds with a desired resistance value. Therefore, when nonvolatile memories are put into practical use, commercialization is difficult because the resistance value of the peripheral circuit memory elements, which must be controlled depending on the use, cannot be adjusted. Furthermore, the resistance ratio between high-resistance and low-resistance states remains at around 10 times; thus, a readout margin as high as that of the Ovonic Unified Memories (OUMs) can not be obtained, thus making it difficult to obtain a capacity stable enough for commercial nonvolatile memories.

Meanwhile, in the technique exemplified in Applied Physics Letters, Vol. 76, No. 19 (2000), pp. 2749-2751, although the resistance ratio between the high resistance and low resistance states represents a wide range such as from 10 to 1000 times, not only is the technology for adjusting to a desired resistance ratio not established, but the stable control of the composition and the cut-down of manufacturing costs are difficult since double oxides are used as resistive elements.

Further, in the technique exemplified in Solid-State Electronics, Vol. 7 (1964), pp. 785-797, the method for forming oxide films uses the oxidization of a Ni substrate from the surface by an oxygen atmosphere. Therefore, the homogeneity of oxidization is insufficient and metallic Ni fibers are suspected to segregate and form ohmic contacts. This is also supported by the tendency of resistance values at the "on" state being extremely low such as 100 to 200Ω when the thickness is 2 to 30 μm, and resistance values being proportional to the thickness.

Furthermore, Solid-State Electronics, Vol. 7 (1964), pp. 785-797 provided pioneering information on the formation and rupture of conductive filaments. However, as the authors of this document themselves admit, the stability of this system's switching phenomenon is poor, and the system is considered to be far from being practically applicable for uses in which many repeated uses are anticipated.

Moreover, as described in Applied Physics Letters, Vol. 88, 202102, (2006), pp. 202102-1-202102-3, if Joule heat plays an important role in the resistance value switching phenomenon, considering the case when the surroundings influence due to integration, particularly when application to nonvolatile memories is envisaged, it would become necessary to establish a production process for stabilizing the reversible variable resistance properties due to the history of electric power application. Alternatively, techniques that increase the resistance ratio between the resistance values at high resistance state and low resistance state to a level sufficient for absorbing the temperature variation would be required.

In addition, when considering application to highly integrated nonvolatile memories, there is concern that appropriate resistance properties may not be obtained for the driving voltage of peripheral electronic circuits under an envisaged design rule, depending on the type of metal oxide film used. Thus, the establishment of a production process focusing on resistance value control is also essential.

Particularly, it is envisioned that increasing and controlling the ratio between resistance values at the high resistance state and low resistance state in reversible variable resistance elements is an essential technical problem in designing a practical device. Thus, the present inventors explored methods to control the resistance ratio.

The present invention was made to solve the above technical problems, and is defined by the following:

(1) a switching element, comprising a metal oxide consisting of a transition metal and oxygen formed between a first electrode and a second electrode by modifying any one or more of the following (a) to (c) of a stoichiometric compound consisting of the transition metal and oxygen:
  (a) crystal structure;
  (b) ionic valence number of metal element; and
  (c) nonstoichiometricity;
(2) the switching element of (1) wherein the metal oxide is $Co_{1-x}O$ (wherein x indicates deviation from the stoichiometric composition and the relation $0<x\leqq0.1$ is fulfilled);
(3) the switching element of (1), wherein the metal oxide is cobalt oxide and the oxygen atom concentration is in a range of 50 to $100\times(4/7)\%$;
(4) the switching element of (1), wherein the metal oxide is $Cu_{1-y}O$ or $Cu_2O_{1+y}$ (wherein y indicates deviation from the stoichiometric composition and the relation $0<y\leqq0.1$ is fulfilled);
(5) the switching element of (1), wherein the metal oxide is copper oxide and the oxygen atomic concentration is in a range of $100\times(1/3)$ to $50\%$;
(6) a method for producing a switching element comprising reversible variable resistance characteristics due to the history of electric power applied between two electrodes, wherein the method comprises the steps of:
  (i) forming a first electrode and a second electrode on a substrate either simultaneously, sequentially, or sequentially intermitted with step (ii) or steps (ii) and (iii);
  (ii) forming, between the first electrode and the second electrode, a metal oxide thin film consisting of a single center metal element and oxygen with compositional fluctuation; and
  (iii) heat-treating the metal oxide thin film at a temperature range of 400 to 800° C.;
(7) a method for producing a switching element comprising reversible variable resistance characteristics due to the history of electric power applied between two electrodes, wherein the method comprises at least the steps of:
  (i) forming on a substrate a metal oxide thin film consisting of a single center metal element and oxygen with compositional fluctuation;
  (ii) etching the metal oxide thin film such that at least a pair of facing surfaces are exposed; and
  (iii) forming, simultaneously or sequentially, a first electrode and a second electrode on at least the pair of facing surfaces of the metal oxide thin film; and wherein the method further comprises between steps (ii) and (iii) the step of:
  (iv) heat-treating the metal oxide thin film at a temperature range of 400 to 800° C.;
(8) a method for producing a switching element comprising reversible variable resistance characteristics due to history of electric power applied between two electrodes, wherein the method comprises at least the steps of:
  (i) forming on a substrate by oxidation, a metal thin film comprising a central metal element constituting a metal oxide thin film consisting of a single center metal element and oxygen with compositional fluctuation;
  (ii) oxidizing at least a part of the metal thin film across the film thickness; and
  (iii) heat-treating at least the oxidized area at a temperature range of 400 to 800° C.;
(9) a method for producing a switching element of any one of (6) to (8), wherein the central metal element in the metal oxide thin film is any one of the metals selected from the group consisting of Co, Cu, Fe, Mn, Ni, and Ti;
(10) a method for producing a switching element of any one of (6) to (8), wherein the metal oxide thin film is $Co_{1-x}O$ (wherein x indicates deviation from a stoichiometric composition and the relation $0<x\leqq0.1$ is fulfilled);
(11) a method for producing a switching element of any one of (6) to (8), wherein the metal oxide thin film is cobalt oxide and the oxygen atomic concentration is in a range of 50 to $100\times(4/7)\%$;
(12) a method for producing a switching element of any one of (6) to (8), wherein the metal oxide thin film is $Cu_{1-y}O$ or $Cu_2O_{1+y}$ (wherein y indicates deviation from a stoichiometric composition and the relation $0<y\leqq0.1$ is fulfilled);
(13) a method for producing a switching element of any one of (6) to (8), wherein the metal oxide thin film is copper oxide and the oxygen atomic concentration is in a range of $100\times(1/3)$ to $50\%$;
(14) a method for producing a switching element of any one of (6) to (13), wherein the first electrode and the second electrode are of a same or different material, and each comprises any one of the metals selected from the group consisting of W, Au, Pd, Ni and Pt;
(15) a method for producing a switching element of any one of (6) to (13), wherein the first electrode and the second electrode are of a same or different material, and each comprises any one of the metals selected from the group consisting of Ti, Cu, Co, Mn, and silicides thereof;
(16) a switching element produced by any one of the methods for producing a switching element of (6) to (15), wherein the switching element comprises a metal oxide thin film sandwiched between a first electrode and a second electrode on a substrate and comprises reversible variable resistance properties due to the history of power applied between the two electrodes; and
(17) a nonvolatile memory comprising a switching element of any one of (1) to (5) and (16), wherein the switching element is used in a data storage unit of the nonvolatile memory.

Herein, the switching elements of the present invention are, for example, elements comprising the composition schematically shown in FIG. 1, in which it is presumed that a voltage or current not less than the first threshold, a voltage or current not more than the second threshold whose absolute value is smaller than that of the first threshold, and a voltage or current not more than the third threshold whose absolute value is smaller than that of the second threshold are selectively applied between the two electrodes. The ratio between the resistance values at the high resistance state and low resistance state reversibly varies at least in the range of $10^1$ to $10^9$ times according to the history of electric power application between the two electrodes. In addition, the state of low resistance value or high resistance value reached as a result of a predetermined application history is maintained in the nonvolatile state until the threshold value is exceeded. Therefore, a sufficient readout margin is expected to be the secured even when applied to the data storage unit of nonvolatile random access memories and such that are in use.

The metal oxides of the present invention are metal oxides consisting of a transition metal and oxygen, which are obtained from stoichiometric compounds comprising the transition metal and oxygen by modifying any one or more of the crystal structure, ionic valence number of the metal elements, or nonstoichiometry. As the metal oxides of the present invention, metal oxides consisting of a single center metal element with compositional fluctuation having an oxygen deficiency or an oxygen-excess composition can be used. More preferably, usable are metal oxides comprising a composition between two kinds of stoichiometric compounds located adjacently on a phase diagram of a central metal element and oxygen. Namely, heat-stable compounds or compounds having the potential (to exist under special conditions such as extreme pressure) are excluded from the metal oxides of the present invention, as are compositions with metallic phase deposition potential.

Specifically, for example, in the case of cobalt oxides ($Co_{1-x}O$), usable are those in which x designates deviation from the stoichiometric composition and the relationship of $0<x\leq0.1$ is fulfilled. Moreover, the concentration of the oxygen atoms is preferably within the range of 50 to $100\times(4/7)\%$; namely, the composition is preferably between $Co_3O_4$ and $CoO$. Meanwhile, in the case of copper oxides ($Cu_{1-y}O$ or $Cu_2O_{1+y}$), usable are those in which y designates deviation from the stoichiometric composition and the relationship of $0<y\leq0.1$ is fulfilled. Moreover, the concentration of the oxygen atoms is preferably within the range of $100\times(1/3)$ to 50%; namely, the composition is preferably between $Cu_2O$ and $CuO$.

Moreover, as a result of using these compositions, preferably selected are those for which the resistance ratio between the high resistance state and low resistance state due to the history of electric power application in the metal oxide thin film as formed is 10 to 1,000,000 times. Furthermore, those for which the ratio finally reaches 10 to $10^9$ times after performing the treatment of the present invention are more preferable.

The "metal oxide thin films" of the present invention do not refer to metal oxide layers having a thickness as in the general meaning of thickness used to describe "thick films" and "thin films" in the field of semiconductors. Because of the technical need that setting/resetting must be carried out by the driving circuit of a usual semiconductor apparatus, there is an appropriate range for the resistance value of electrodes sandwiching metal oxides after forming, and the film thickness that enables this resistance value is naturally limited.

Considering that the driving voltage of the peripheral circuit and the set voltage become lower than the forming voltage, a specific film thickness is preferably 10 to 200 nm. Moreover, considering the homogeneity of metal oxide thin films and the diameter of crystal particles, it is more preferably 60 to 200 nm.

In providing a general explanation for the history of electric power application in the present invention, the process of first applying an electric power to the elements after element formation and causing transition from a high resistance state to a low resistance state is called "forming" for convenience.

In addition, the process of reapplying an electric power in a low resistance state and causing transition from a low resistance state to a high resistance state is called "resetting" for convenience. Meanwhile, the process of causing transition from a high resistance state to a low resistance state after forming is called "setting" for convenience.

The treatments of the present invention comprise high temperature heat treatment of the metal oxide thin films and treatment of exposing the surface of metal oxide thin films to oxygen plasma. The temperature range for the heat treatment of the present invention is preferably 400 to 800° C. However, in the case of heat treatment at 400° C., a treatment period of about ten minutes is not enough and heating for a longer period of time is required. Meanwhile, at 800° C., it is necessary to make the heating period shorter because the resistance properties become somewhat impaired.

Further, the structure of the switching elements of the present invention is, as exemplified in FIG. 1, not necessarily restricted to laminated structures sequentially stacked in a vertical direction, and each layer can be lined up on a horizontal plane. For example, electrodes, wiring connected thereto, and metal oxides with a central metal element of the same metal as the electrode material can be lined up. In this case, they are also formed by first forming metal oxide thin films in a necessary pattern, using a part thereof as one electrode pair, masking the electrodes, the wiring parts, and such with a resist and such to make the area between the electrodes a metal oxide thin film, and performing an oxidation treatment from the surface to the direction of the thickness of the thin film.

EXPLANATIONS OF LETTERS OR NUMERALS

I: Ammeter
V: Voltmeter

DETAILED DESCRIPTION OF THE INVENTION

Figure 1:
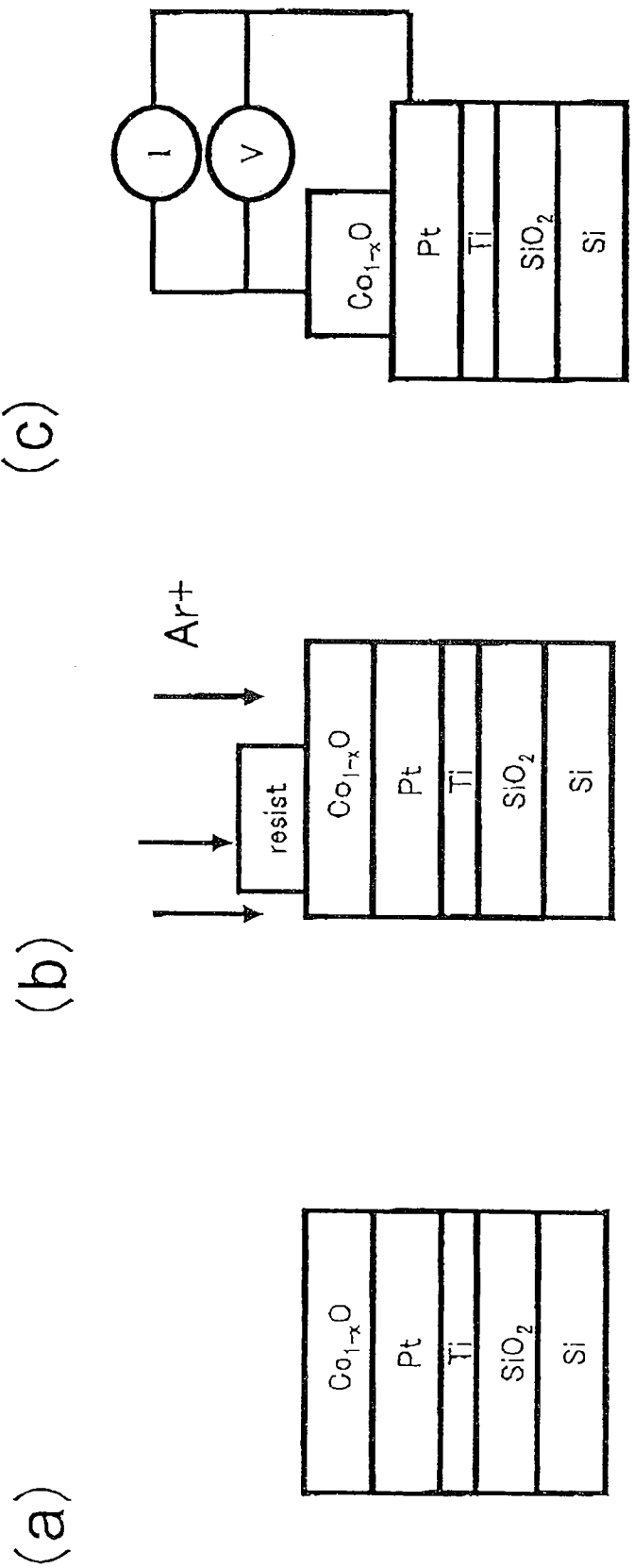
FIG. 1 shows schematic diagrams of the structure of the elements of the present invention and their measurement circuits.

Hereinafter, methods for producing the switching elements that are the subjects of the treatments of the present invention are explained. First, a Ti layer, Pt layer, and metal oxide layer were stacked in this order on an Si substrate having a thermally-oxidized film by the RF magnetron sputtering method and, as shown in FIG. 1, a laminated structure of Ti/Pt/metal oxide thin film (that in the figure being $Co_{1-x}O$) was formed. Usually, Pt layers and such are further formed for use as the upper electrode. However, for the convenience of production of the elements, a pair of electrodes was formed by directly contacting a W probe with the surface of the metal oxide layer. Other film formation methods such as laser-ablation, chemical vapor deposition (CVD), and oxidization of metal (surfaces) can also be used in the present invention.

Herein, the Ti layer plays the role of a "glue" to improve the adhesiveness of the Pt layer (the electrode) to substrate, and was formed under the conditions of 200 W of RF output and 100% Ar gas at 0.5 Pa pressure to the Ti target, and room temperature for substrate temperature. Meanwhile, the Pt layer was formed under the conditions of 100 W of RF output, 100% Ar gas at 0.3 Pa pressure, and room temperature for substrate temperature. The thickness of the Pt layer was set to 100 nm.

On the other hand, the formation of metal oxide films was carried out using Co—O type or Cu—O type targets under the conditions of 200 W of RF output, an Ar gas atmosphere comprising 4% $O_2$ gas at a gas pressure of 0.5 Pa, and room temperature or 300° C. for substrate temperature. When a fluctuation is actively introduced into the composition of the metal oxide thin films, values of x or y in $Co_{1-x}O$, $Cu_{1-y}O$, or $Cu_2O_{1+y}$ can be controlled by regulating the mixing ratio of Ar and $O_2$ in the atmosphere.

When the composition of the oxide thin films (Co—O system) formed under the above-mentioned deposition conditions was analyzed by X-ray photoelectron spectrometry, the films were judged to have a composition near $Co_3O_4$ immediately after film formation (see FIG. 5 mentioned later). Further, metal oxide thin films with a thickness in the range of 60 to 200 nm were experimentally produced. A stylus profilometer from KLA-Tencor Corporation was used to measure the thickness of each of these films.

As shown in FIG. 1(b), element separation was then carried out by photolithography using an i-line reduced projection type exposure device and Ar ion milling. Ar ion milling was carried out at an applied voltage of 300 V. Other methods such as electron beam lithography and contact mask aligner can be used as methods to separate elements in the present invention. Further, as shown in FIG. 1(c), current and voltage (I-V) properties were measured by contacting a tungsten probe with the surface of the above-mentioned metal oxide thin films using a prober equipment. Semiconductor Parameter Analyzer 4156C from Agilent was used as the equipment to measure the I-V properties in these systems.

Figure 2:
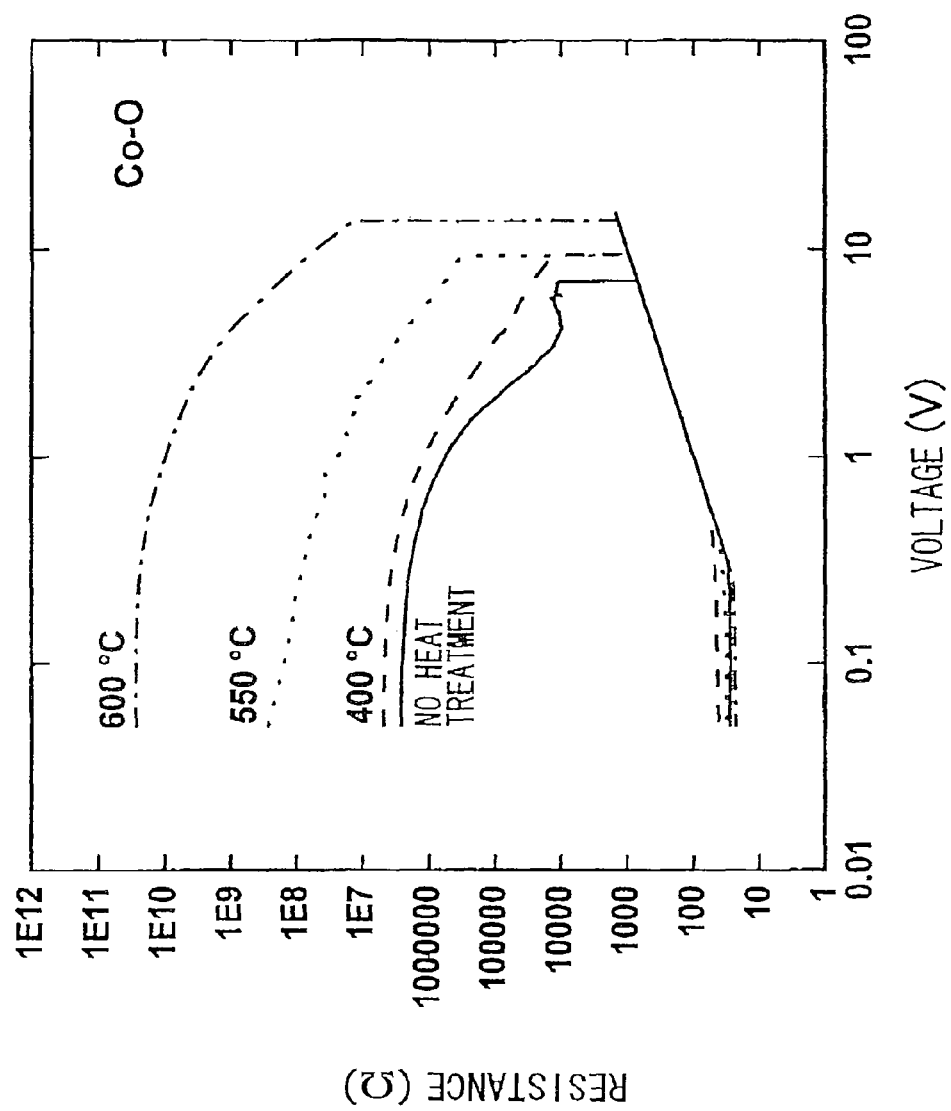
FIG. 2 depicts the effects of the heat treatment of the present invention on the resistance properties of Co—O type metal oxide.

Prior to performing the treatments required in the present invention on the switching elements produced as above, the behavior of the resistance value according to the electric power application history of the elements of the cobalt oxide thin film as formed and with no heat treatment is shown in FIG. 2 by a solid line as a comparative example. When the voltage between the two electrodes was increased to about 10 V over a sufficiently long period of time, as apparent from the (upper) solid curve line in FIG. 2, the resistance value began to decrease at around 1 V, decreased significantly from around 5 V, and sharply dropped just before 10 V. This process in which the resistance value sharply drops is called "forming". Then, when the voltage was decreased from 10 V, the resistance value tended to decrease to about 0.2 V and indicated a constant value of around 20Ω at lower voltages.

Figure 3:
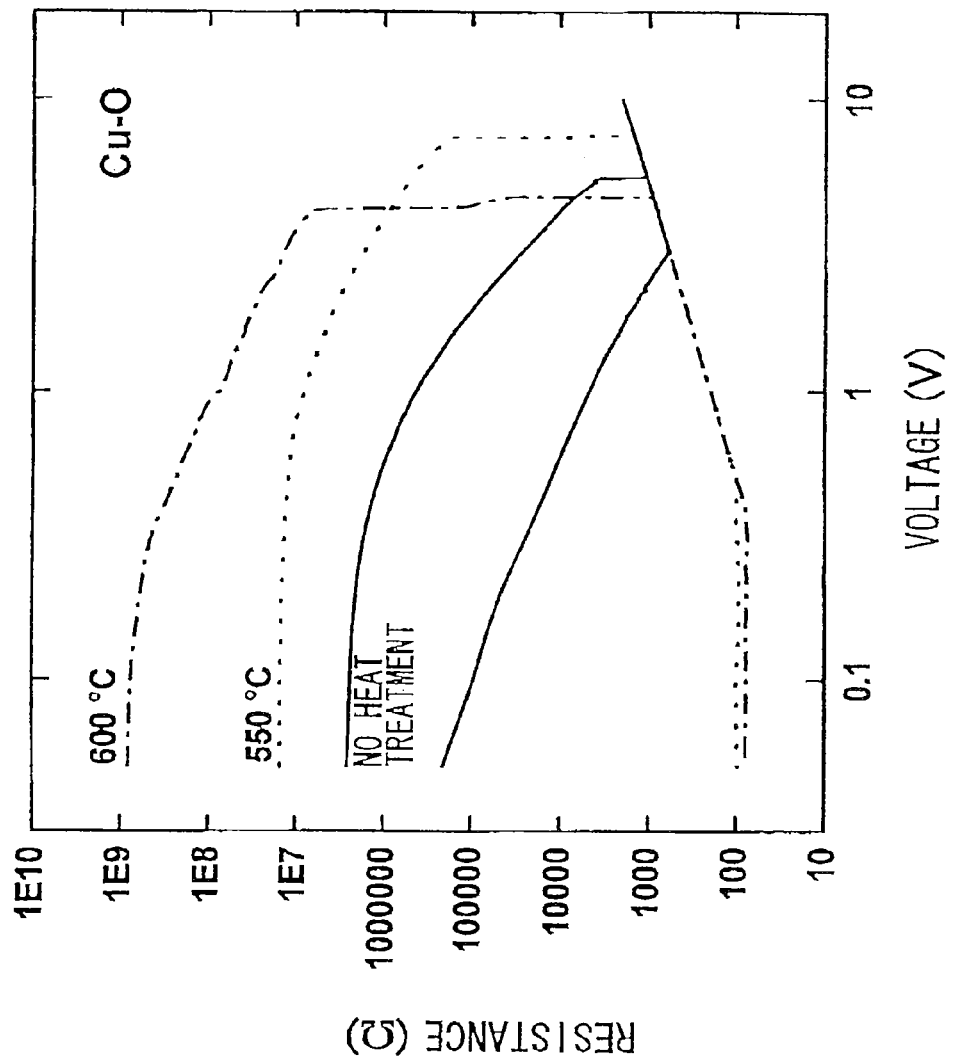
FIG. 3 depicts the effects of the heat treatment of the present invention on the resistance properties of Cu—O type metal oxide.

Similarly, the behavior of resistance value according to the electric power application history of the elements of the copper oxide thin film as formed and with no heat treatment is shown in FIG. 3 by a solid line. In contrast to cobalt oxide thin films of FIG. 2, the resistance value did not indicate a constant value in both the high resistance and low resistance states in the case of no heat treatment, and a negative correlation to the voltage was observed. Furthermore, the resistance ratio varied by only one to two digits between the high resistance and low resistance states over a wide voltage range. Thus, it was revealed that application to practical devices is difficult in this state.

In contrast, a 10-minute Rapid Thermal Annealing (RTA) under an Ar atmosphere at a temperature range of 400 to 600° C. is performed in the present invention to the elements after film formation and before forming that are on the substrate at room temperature.

The present invention enables the achievement of a desired resistance ratio by inserting metal oxides comprising transition metals and oxygen between electrodes, in which either one or more of the crystal structure, ionic valence number of the metal elements, or nonstoichiometry is modified in the stoichiometric compounds consisting of the transition metal and oxygen. The present invention also enables the increase and control of the ratio of the resistance value at the high resistance state to the resistance value at the low resistance state by performing a heat treatment at a predetermined temperature range on metal oxide thin films consisting of a single center metal element having a compositional fluctuation. Thus, the present invention realized a sufficiently large readout margin by enabling the control of reversible resistance variation at a level required for application to practical memory devises and such.

Furthermore, the present invention can significantly improve the degree of freedom when designing processes of practical devices, because the resistance ratio can be similarly controlled even if heat treatment processes of metal oxide thin films are carried out in any order with respect to the electrode formation processes.

All patents, published patent applications, and publications cited herein are incorporated by reference in their entirety.

EXAMPLES

Hereinbelow, the present invention will be specifically described with reference to the Examples, but it is not to be construed as being limited thereto.

Example 1

FIG. 2 shows the result of performing Rapid Thermal Annealing (RTA) on elements that have a structure of Ti/Pt/metal oxide thin films ($Co_{1-x}O$ or $Cu_{1-y}O$ (or $Cu_2O_{1+y}$)) before forming treatment but after film formation, at a temperature range of 400 to 600° C. for ten minutes according to the above-described embodiment. FIG. 3 shows the result when the heat treatment of the present invention was not carried out. Dashed line, dotted line, and dashed-dotted line indicate the results at 400° C., 550° C., and 600° C., respectively.

As a result, it was observed that when a Co—O system was used for the metal oxide thin film, the resistance value and forming voltage at the high-resistance state tended to increase as the temperature of heat treatment before forming was increased. In contrast, when a Cu—O system was used for the metal oxide thin film, comparison of those with 550° C. heat treatment and those without heat treatment showed a similar tendency of increased forming voltage; however, those with 600° C. heat treatment have a lower forming voltage than those without heat treatment.

Further, when a Co—O system was used for the metal oxide thin film, a tendency of enlarged flat areas for the high-resistance and low-resistance values was observed. In contrast, when a Cu—O system was used for the metal oxide thin film, those that are heat treated at 550° C. showed a similar tendency of enlarged flat areas for the high resistance and low resistance values; however, those with 600° C. heat treatment have a smaller flat area than those without heat treatment. In either case, when the voltage is 1 V or less, a larger and more stable ratio between the high resistance value and low resistance value can be obtained as compared with cases of no heat treatment. When the metal oxide thin film was of a Co—O system and the temperature was 600° C., the high resistance value was $10^9$ times the low resistance value at 0.2 V. On the other hand, when the metal oxide thin film was of a Cu—O system and the temperature was 600° C., the high resistance value was $10^7$ times the low resistance value at 0.2 V.

It was confirmed that with any element that undergoes the heat treatment of the present invention, if the voltage range of constant resistance value is increased and the heat treatment can be set at a high temperature, a large resistance ratio can be obtained, as compared with cases that do not undergo the heat treatment of the present invention.

Example 2

Next, the 2p electron level of Co was measured using an X-ray photoelectron spectrometer (XPS) for the surface of metal oxide thin films (Co—O system) immediately after formation using CoO as the sputtering target according to the aforementioned conditions, and for the surface of films heat-treated according to the aforementioned embodiment of the present invention.

Figure 4:
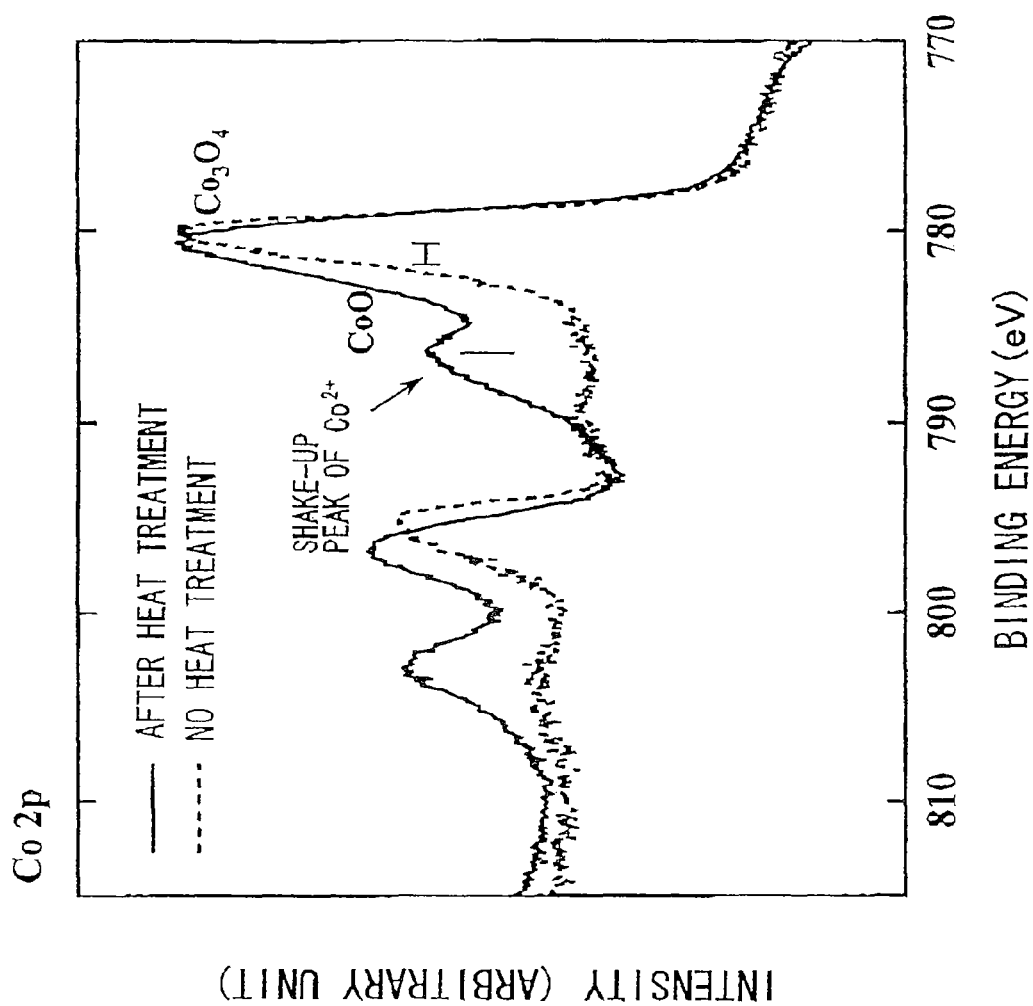
FIG. 4 depicts the effect of the heat treatment of the present invention on the results of X-ray photoelectron spectrometry of cobalt oxides.

The results are shown in FIG. 4 and were plotted with binding energy (eV) on the horizontal axis and X-ray photoelectron intensity (arbitrary unit) on the vertical axis. The dashed line indicates results without heat treatment and the solid line indicates results after the heat treatment of the present invention. As obvious from FIG. 4, a peak appeared at 780 to 790 eV as a result of the heat treatment of the present invention. Since this is considered to be the peak for CoO, it was confirmed that after the heat treatment of the present invention, materials having a composition close to the stoichiometric compound $Co_3O_4$ in the absence of heat treatment became mixed crystals with $Co_3O_4$ that have CoO as the main phase.

It may seem strange that a composition close to $Co_3O_4$ was obtained even if CoO was used as the sputtering target. However, this can be rationally explained if, for example, the temperature for film formation is 300° C. and the atmospheric gas pressure is 0.5 Pa, as in M. Chen et al., Journal of Phase Equilibria 24, 212 (2003). However, the important point is that, even though the deposition of thin films with a composition quite different from the composition of the sputtering target may be somehow anticipated, the fact that the composition can be controlled by heat treatment after formation is unexpected.

INDUSTRIAL APPLICABILITY

As described above, the present invention provides switching elements having desired reversible and variable resistance properties. The heat treatment of the present invention also provides controllability of resistance values (particularly, the resistance values for high-resistance states) for switching elements that use metal oxide thin films comprising reversible variable resistance.

Furthermore, through regulation to increase the resistance ratio, the present invention provides switching elements that can be applied to data storage units of highly-integrated nonvolatile memories that require a sufficient readout margin.

We claim:

1. A switching element, comprising a first electrode, a second electrode and a metal oxide thin film sandwiched between the first electrode and the second electrode, the metal oxide thin film consisting essentially of a nonstoichiometric cobalt metal oxide wherein the oxygen atom concentration is in a range of 50 to 100×(4/7)% or a nonstoichometric copper oxide wherein the oxygen atomic concentration is in a range of 100×(1/3) to 50%.

2. The switching element of claim 1 wherein the metal oxide thin film consists essentially of $Co_{1-x}O$ (wherein x indicates deviation from the stoichiometric composition and the relation $0<x\leqq0.1$ is fulfilled).

3. The switching element of claim 1, wherein the metal oxide thin film consists essentially of CoO and $Co_3O_4$ wherein O/(Co+O)×100 is in a range of 50 to 100 x (4/7) %.

4. The switching element of claim 1, wherein the metal oxide thin film consists essentially of $Cu_{1-y}O$ or $Cu_2O_{1+y}$ (wherein y indicates deviation from the stoichiometric composition and the relation $0<y\leqq0.1$ is fulfilled).

5. The switching element of claim 1, wherein the metal oxide thin film consists essentially of CuO and $Cu_2O$ wherein O/(Cu+O)×100 is in a range of 100 x (1/3) to 50%.

6. The switching element of any one of claims 1 to 5, wherein at least one of the electrodes is in contact with mixed crystals consisting essentially of a plurality of compounds of cobalt or copper with oxygen.

7. The switching element of claim 6, wherein the switching element comprises reversible variable resistance properties due to the history of power applied between the two electrodes.

8. A nonvolatile memory comprising the switching element of claim 7, wherein the switching element is used in a data storage unit of the nonvolatile memory.

* * * * *

UNITED STATES PATENT AND TRADEMARK OFFICE
CERTIFICATE OF CORRECTION

PATENT NO. : 7,923,711 B2
APPLICATION NO. : 11/881575
DATED : April 12, 2011
INVENTOR(S) : Hisashi Shima et al.

It is certified that error appears in the above-identified patent and that said Letters Patent is hereby corrected as shown below:

Cover Page Item 30

In the Foreign Application Priority Data section:

add --July 26, 2006 (JP) 2006-203025--.

Signed and Sealed this
Sixteenth Day of August, 2011

David J. Kappos
*Director of the United States Patent and Trademark Office*